(12) United States Patent
Wang

(10) Patent No.: US 6,788,047 B1
(45) Date of Patent: Sep. 7, 2004

(54) DUT BOARD FOR ELIMINATING ELECTROSTATIC DISCHARGE DAMAGE

(75) Inventor: Chien-Hung Wang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 17 days.

(21) Appl. No.: 10/249,371

(22) Filed: Apr. 3, 2003

(51) Int. Cl.[7] .............................................. G01R 31/02
(52) U.S. Cl. ..................................... 324/158.1; 324/760
(58) Field of Search ............................. 324/158.1, 73.1, 324/760, 765, 452; 361/212; 165/80.3, 80.4; 438/14, 18

(56) References Cited

U.S. PATENT DOCUMENTS 5,543,727 A * 8/1996 Bushard et al. ............. 324/760
5,659,245 A * 8/1997 Ping et al. ................ 324/158.1

* cited by examiner

Primary Examiner—Vinh P. Nguyen
(74) Attorney, Agent, or Firm—Winston Hsu

(57) ABSTRACT

An IC tester system for eliminating electrostatic discharge damage. The IC tester system includes a temperature control oven and an IC test board. The IC test board contacts a dummy conducting wire and a grounding interface for grounding out the electrostatic discharge (ESD) generated during the loading and unloading of the test board through thermal-insulated rubber installed in the door of the oven.

17 Claims, 2 Drawing Sheets

DUT BOARD FOR ELIMINATING ELECTROSTATIC DISCHARGE DAMAGE

BACKGROUND OF INVENTION

1. Field of the Prior Art

The present invention relates to an IC tester system, and more particularly, to a DUT board for eliminating electrostatic discharge (ESD) damage.

2. Description of the Prior Art

The reliability of products is a very important factor in the manufacturing process of IC chips. The reliability can be simply defined as the lifetime of a product under normal conditions. The IC chip manufacturers need to know the lifetime of products in advance; therefore an accelerated lifetime test is used to forecast the average lifetime. The theorem of the accelerated lifetime test is to test the lifetime of products under strict conditions, such as in a high temperature or pressure environment, and to high voltage or high current. Then the lifetime model is used to forecast real lifetime under normal conditions. Typical reliability tests are classified into wafer-level reliability (WLR) tests and package-level reliability (PLR) tests. The WLR test means to test the wafer directly in a production line. The PLR test means to segment and package a wafer as devices-under-test (DUT), and to insert those DUT into a DUT board to test in a high temperature oven. The stress condition of the PLR test is closer to the normal working conditions, and therefore the test result is widely accepted.

Please refer to FIG. 1. FIG. 1 is a schematic diagram of an IC tester device according to the prior art. As shown in FIG. 1, the IC tester device 10 of the prior art comprises a temperature control oven body 12 and an oven door 14. The oven door 14 has a thermal-insulated material 16 thereon, such as rubber. The thermal-insulated material 16 is pasted in the oven door 14 for maintaining proper testing temperature, and has long gaps so as to allow a DUT board 30 to pass through and fix on the oven door 14. The DUT board 30 includes a DUT socket 34 for installing a DUT, a testing conducting wire 36, and a testing interface (also called bonding fingers) 38 for connecting to a port of a testing unit (not shown). When the test is performed, the following steps are executed: installing the packaged DUT 32 to the DUT socket 34, loading the DUT board 30 into the gap of the thermal-insulated material 18 in the oven door 14, closing the oven door 14, and performing the electric property test in a high temperature environment provided by the temperature control oven 12.

However, the IC tester device 10 of the prior art is not able to prevent the ESD damage. When the DUT board 30 is loaded to the gap of the thermal-insulated material 18 in the door 14, the ESD generated by the friction between the testing interface 38 and the thermal-insulated material 16 will damage the DUT. Similarly, after the test completes, when the DUT board 30 is unloaded, the ESD will also damage the DUT.

The present remedy for the ESD problem is to use specific fixtures. The IC DUTs are isolated one by one with the specific fixtures by hand when installing to the DUT socket of the DUT board. After loading the DUT boards to the oven door, the specific fixtures of each DUT are taken off one by one by hand for performing the IC test.

Similarly, when the IC test completes, the same procedure are performed to prevent the ESD damage. Although the specific fixtures can avoid ESD, it costs too much time to put on and take off the specific fixtures. Furthermore, with the complicated steps, the DUT may be damaged because of human negligence. Thus the purpose of decreasing the cost and improving the effects of the IC test is still not achieved. As a result, an IC tester for preventing damage from ESD with simple related operation method is eagerly necessary.

SUMMARY OF INVENTION

It is therefore a primary objective of the claimed invention to provide an IC tester system for eliminating the electrostatic discharge (ESD) damage to solve the problem caused by ESD during the testing process of the prior art.

According to the claimed invention, an IC tester system for eliminating the ESD damage is disclosed. The IC tester system comprises a temperature control oven and at least a DUT board. The temperature control oven includes an oven body and a door having a thermal-insulated material thereon. The DUT board includes a board body, at least a DUT socket, a testing interface, a grounding interface, a testing conducting wire, and a dummy conducting wire. The ESD generated by the friction between the testing wire and the thermal-insulated material during the loading and unloading action of the DUT board is grounded out via the dummy conducting wire and the grounding interface.

The IC tester system of the present invention has a dummy conducting wire and a grounding interface so that the ESD generated by the friction between the testing wire and the thermal-insulated material can be grounded out in advance before testing. This can prevent the DUT from being damaged by the ESD, and can further improve the accuracy of the IC electric property test.

DETAILED DESCRIPTION

Figure 1:
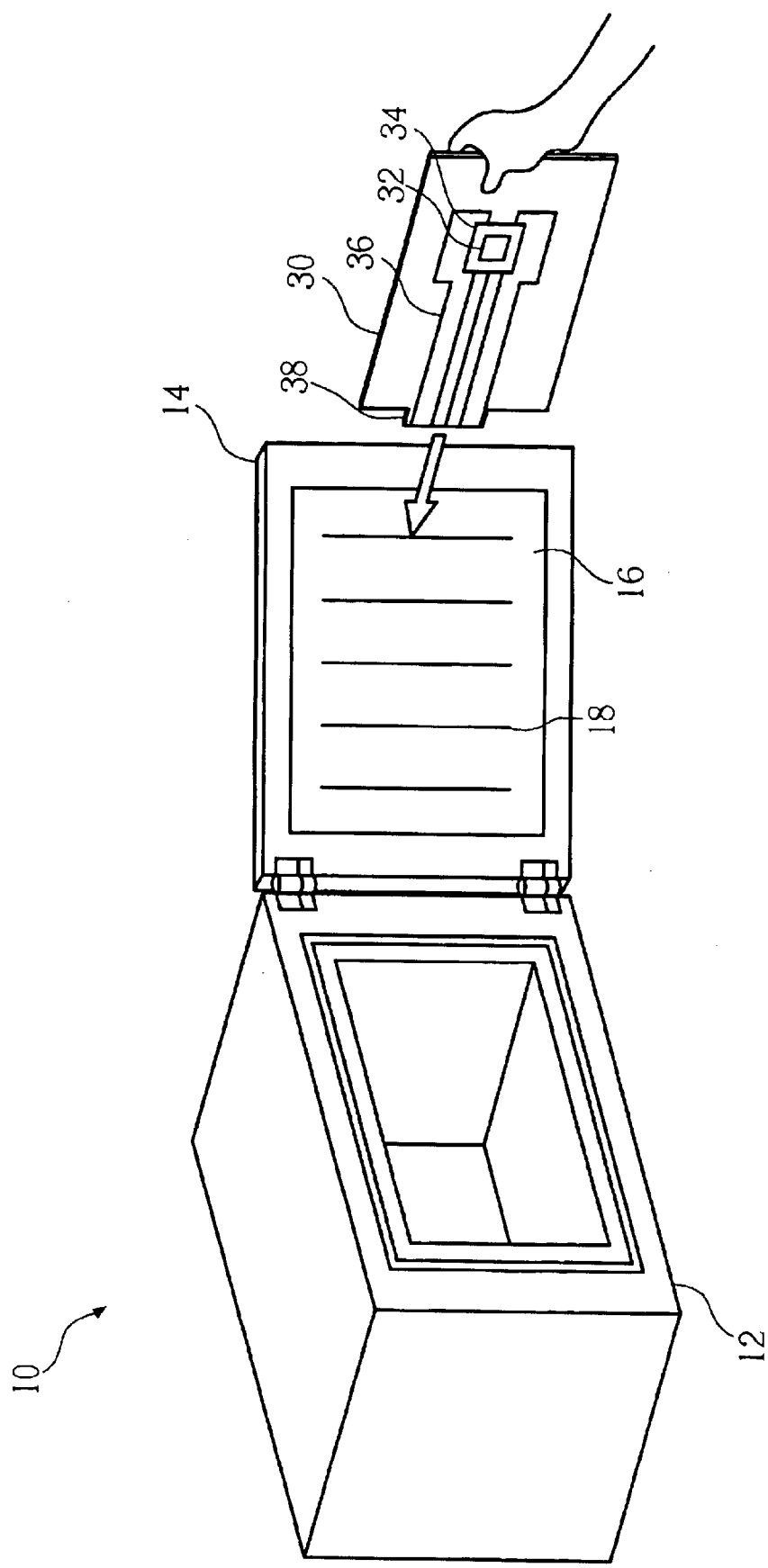
FIG. 1 is a schematic diagram of an IC tester device according to the prior art.
Figure 2:
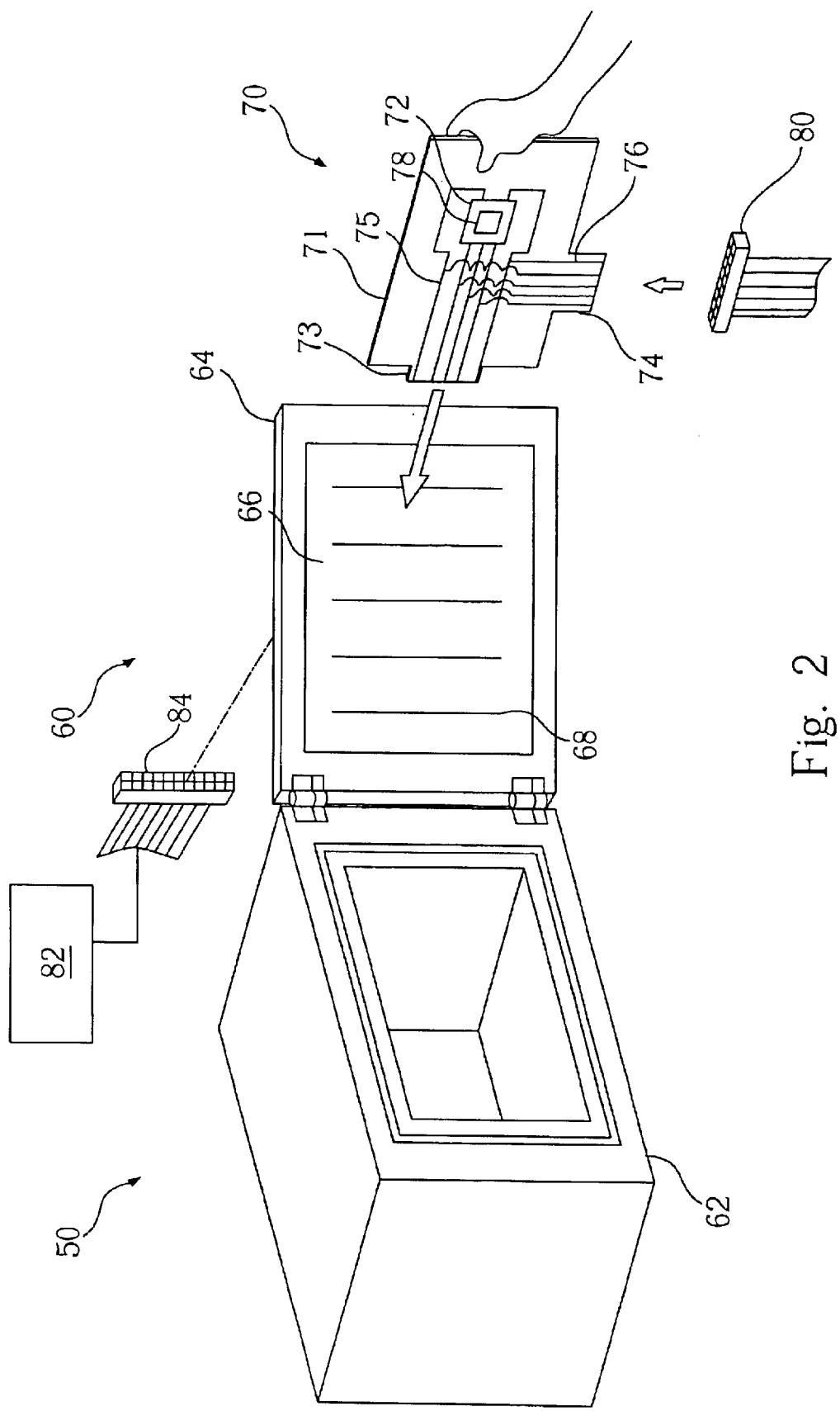
FIG. 2 is a schematic diagram of an IC tester system according to the present invention.

Please, refer to FIG. 2. FIG. 2 is a schematic diagram of an IC tester system according to the present invention. As shown in FIG. 2, the IC tester system 50 of the present invention comprises a temperature control oven 60 and a DUT board 70. The temperature control oven 60 includes an oven body 62 for providing proper testing temperature, an oven door 64, and a thermal-insulated material 66 having long gaps 68 thereon, installed on the oven door 64 for maintaining proper testing temperature. The DUT board 70 includes a board body 71, a DUT socket 72 set up in the board body 71 for installing a DUT 78, a testing interface 73 for connecting to a port 84 of a testing unit 82, a grounding interface 74 for connecting to a grounding port 80, a testing conducting wire 75 for connecting to the DUT socket 72 and the testing interface 73, and a dummy conducting wire 76 for connecting to the testing conducting wire 75 and the grounding interface 74. For simplifying description, the IC tester system 50 of the present invention comprises only one DUT board 70, and the DUT board 70 comprises only one DUT socket 72. However, the IC tester system 50 of the present invention can comprise a plurality of DUT boards 70, and the DUT boards 70 can comprise a plurality of DUT socket 72 for testing a plurality of DUTs.

The testing procedure includes plugging the DUT 78 into the DUT socket 72, connecting the grounding interface 74 to the grounding port 80, and loading the DUT board 70 to the gap 68 of the thermal-insulated material 66 by hand. At present, the ESD generated by the friction between the testing conducting wire 75 and the thermal-insulated material 66 will be grounded out via the grounding port 80. The testing procedure also includes removing the grounding port 80, closing the oven door 64, and finally electrically connecting the testing interface 73 to the port 84 of the testing unit 82 to perform the electric property test under predetermined testing conditions.

When the test completes, steps performed include removing the port 84 of the testing unit 82, opening the oven door 64, connecting the grounding interface 74 to the grounding port 80, and unloading the DUT board 70 from the thermal-insulated material 66 by hand. At present, the ESD generated by the friction will be grounded out via the grounding port 80. Next, the grounding port is removed and the DUT 78 is uninstalled from the DUT socket 72.

In contrast to the IC tester device of the prior art, a dummy conducting wire and a grounding interface are designed in the IC tester system of the present invention. This novel design permits grounding out the ESD generated by the friction between the testing conducting wire and the thermal-insulated material. Therefore the present invention can overcome the disadvantage of the prior art and further raise the accuracy of the electric property test.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A device under test (DUT) board for eliminating electrostatic discharge damage while testing electric properties of a DUT, the DUT board comprising:
   a board body;
   a DUT socket installed in the board body for receiving the DUT;
   a testing interface located in a fringe of the board body;
   a grounding interface located in another fringe of the board body;
   a testing conducting wire laid on the board body, one end being electrically connected to the DUT socket, another end being connected to the testing interface; and
   a dummy conducting wire laid on the board body, one end being electrically connected to the testing conducting wire, another end being connected to the grounding interface;
   wherein the dummy conducting wire is used to ground out the electrostatic discharge (ESD) generated during a loading and unloading action of the DUT board through a temperature control oven door.

2. The DUT board of claim 1 wherein thermal-insulated material is pasted in the temperature control oven door, the thermal-insulated material comprising at least a long gap penetrating the door, the gap allowing the DUT board to pass through the gap.

3. The DUT board of claim 1 wherein the DUT socket has a plurality of pin holes for the insertion of corresponding pins of the DUT.

4. The DUT board of claim 1 wherein the testing interface is electrically connected to a port of a testing unit.

5. The DUT board of claim 1 wherein before testing, the grounding interface is electrically connected to a grounding port, the DUT board is loaded into the temperature control oven door, and the electrostatic discharge generated during the loading action through the door is grounded out by the dummy conducting wire, then the grounding port is removed, the door is closed, and the testing interface is electrically connected to a port of a testing unit.

6. The DUT board of claim 4 wherein after testing, the port of the testing unit is removed, the door is opened and the grounding interface is electrically connected to a grounding port, then the DUT board is unloaded from the door, the electrostatic discharge generated during the unloading action through the door is grounded out by the dummy conducting wire, and the grounding port is removed.

7. An IC tester system comprising:
   a temperature control oven comprising:
      an oven body for containing a DUT board and providing proper testing temperature;
      a door having thermal-insulated material connected to the oven body, the thermal-insulated material having at least a long gap;
   a DUT board for eliminating electrostatic discharge damage comprising:
      a board body;
      a DUT socket installed in the board body for receiving a DUT;
      a testing interface located in a fringe of the board body;
      a grounding interface located in another fringe of the board body;
      a testing conducting wire laid on the board body, wherein one end is electrically connected to the DUT socket, and another end is connected to the testing interface;
      a dummy conducting wire laid on the board body, wherein one end is electrically connected to the testing conducting wire, and another end is connected to the grounding interface; and
   a testing unit connected to the testing interface for testing the DUT;
   wherein the testing interface passes through the long gap of the thermal-insulated material in the door when testing.

8. The IC tester system of claim 7 wherein the thermal-insulated material is rubber.

9. The IC tester system of claim 7 wherein the DUT socket has a plurality of pin holes for the insertion of corresponding pins of the DUT.

10. The IC tester system of claim 7 wherein the testing interface is connected to a port of the testing unit.

11. The IC tester system of claim 7 wherein before testing, the grounding interface is electrically connected to a grounding port, the DUT board is loaded into the temperature control oven door, and the electrostatic discharge generated during the loading action through the door is grounded out by the dummy conducting wire, then the grounding port is removed, the door is closed, and the testing interface is electrically connected to a port of a testing unit.

12. The IC tester system of claim 10 wherein after testing, the port of the testing unit is removed, the door is opened and the grounding interface is electrically connected to a grounding port, then the DUT board is unloaded from the door, the electrostatic discharge generated during the unloading action through the door is grounded out by the dummy conducting wire, and the grounding port is removed.

13. An IC tester device for eliminating electrostatic discharge damage while testing a DUT, the IC tester device comprising:
   a temperature control oven comprising:
      an oven body for providing proper testing temperature;
      a door having thermal-insulated material connected to the oven body, the thermal-insulated material having at least a long gap;

a DUT board plugged in the gap of the thermal-insulated material comprising:
- a board body containing a first part and a second part, wherein when testing, the first part is inside the oven body and the second part is outside the oven body;
- a DUT socket set up in the first part of the board body for receiving a DUT;
- a testing interface located in a fringe of the second part of the board body;
- a grounding interface located in a fringe of the first part of the board body;
- a testing conducting wire laid on the board body, wherein one end is electrically connected to the DUT socket, and another end is connected to the testing interface;
- a dummy conducting wire laid on the board body, wherein one end is electrically connected to the testing conducting wire, and another end is connected to the grounding interface; and a testing unit connected to the testing interface for testing the DUT.

14. The IC tester device of claim 13 wherein the thermal-insulated material is rubber.

15. The IC tester device of claim 13 wherein the DUT socket has a plurality of pin holes for the insertion of corresponding pins of the DUT.

16. The IC tester device of claim 13 wherein the testing interface is connected to a port of a testing unit.

17. The IC tester device of claim 13 wherein before testing, the grounding interface is electrically connected to a grounding port, the DUT board is loaded into the temperature control oven door, and the electrostatic discharge generated during the loading action through the door is grounded out by the dummy conducting wire, then the grounding port is removed, the door is closed, and the testing interface is electrically connected to a port of the testing unit.

* * * * *